(12) United States Patent    (10) Patent No.: US 7,787,306 B2
Park et al.    (45) Date of Patent: Aug. 31, 2010

(54) NONVOLATILE SEMICONDUCTOR MEMORIES FOR PREVENTING READ DISTURBANCE AND READING METHODS THEREOF

(75) Inventors: Jung-Hoon Park, Gyeonggi-do (KR); Sung-Soo Lee, Gyeonggi-do (KR); Young-Ho Lim, Gyeonggi-do (KR); Chang-Sub Lee, Gyeongsangbuk-do (KR); Ki-Tae Park, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 163 days.

(21) Appl. No.: 12/172,904

(22) Filed: Jul. 14, 2008

(65) Prior Publication Data

US 2009/0052257 A1    Feb. 26, 2009

(30) Foreign Application Priority Data

Jul. 13, 2007    (KR) ...................... 10-2007-0070667

(51) Int. Cl.
*G11C 16/06* (2006.01)
(52) U.S. Cl. ............................ 365/185.23; 365/185.17; 365/185.18; 365/185.33

(58) Field of Classification Search ............ 365/185.23, 365/185.17–185.18, 185.21, 185.03, 185.33, 365/230.06
See application file for complete search history.

(56) References Cited

U.S. PATENT DOCUMENTS 7,009,881 B2 *    3/2006    Noguchi ................ 365/185.17
2006/0256618 A1    11/2006    Nazarian

FOREIGN PATENT DOCUMENTS

JP    11-86574    3/1999
KR    2000-0054882    9/2000
KR    10-2006-0002801    1/2006

\* cited by examiner

*Primary Examiner*—David Lam
(74) *Attorney, Agent, or Firm*—Myers Bigel Sibley & Sajovec, PA

(57) ABSTRACT

A method of reading a flash memory device can include driving a selected word line by applying a selection voltage thereto and driving unselected word lines by applying a first voltage thereto, driving the unselected word lines and first and second selection lines by applying a second voltage that is higher than the first voltage thereto, and reading data from a memory cell that is coupled to the selected word line.

6 Claims, 14 Drawing Sheets

NONVOLATILE SEMICONDUCTOR MEMORIES FOR PREVENTING READ DISTURBANCE AND READING METHODS THEREOF

CROSS-REFERENCE TO RELATED APPLICATIONS

This application claims priority from Korean Patent Application No. 10-2007-0070667 filed on Jul. 13, 2007, the entire contents of which are incorporated herein by reference.

TECHNICAL FIELD

The disclosed technology generally relates to semiconductor memory devices and, more particularly, to nonvolatile memory devices and methods of reading such devices.

BACKGROUND

In response to a growing demand for electrically erasable and programmable semiconductor memory devices that can operate without having to refresh retained data, there is a need for enhancing the storage capacity and integration density of such memory devices.

Flash memories are known for being capable of offering large capacity and high integration density without reliance on refreshing functions. Because of their ability to retain data, even when there is no supplied power, flash memory devices are widely used in many kinds of electronic devices, especially devices that may be prone to experiencing frequent interruptions in power.

FIG. 1 is a sectional diagram of a generic flash memory cell 100 that includes a source 120 and a drain 130, which are formed with a channel region interposed therebetween in a P-type semiconductor substrate 110. The flash memory cell 100 also includes a floating gate 140 that is formed by an insulation film interposed with the channel region, and a control gate 150 that is formed by an insulation film interposed with the floating gate 140.

The source 120, the drain 130, the control gate 150, and the semiconductor substrate 110 are coupled to voltage terminals Vs, Vd, Vg, and Vb, respectively, for applying voltages thereto in operations such as programming, erasing, and reading.

For example, during a programming operation, a program voltage (15V~20V) is applied to the control gate 150 of a selected flash memory cell, while a pass voltage (about 10V) lower than the program voltage is applied to an unselected flash memory cell. Under this bias condition, electrons are injected into the floating gate due to a Fowler-Nordheim (F-N) tunneling effect. If electrons are accumulated in the floating gate, a threshold voltage of the flash memory cell is elevated. By varying a threshold voltage of the flash memory cell, data can be stored in the flash memory cell.

When a selection voltage (Vselect) is applied to the control gate 150 of the flash memory cell 100, data stored in the flash memory cell 100 is detected according to whether a cell transistor of the memory cell is turned on or off. For instance, if a memory cell transistor is turned on when a selection voltage is applied to the control gate 150 of the flash memory cell 100, the flash memory cell 100 is deemed not programmed. In contrast, if a memory cell transistor is turned on when a selective voltage is applied to the control gate 150 of the flash memory cell 100, the flash memory cell 100 is deemed programmed. In this way, a reading operation can be carried out. For example, control gates of unselected memory cell transistors are supplied with a read voltage (i.e., unselective read voltage Vread).

Programming of the flash memory cell 100 is not complete until a threshold voltage of the memory cell rises up sufficiently by injection of electrons into the floating gate 140. Thus, a reading verification operation is needed to determine whether enough electrons are accumulated in the floating gate 140 to raise the threshold voltage of the flash memory cell 100.

As such, reading and reading verification operations are required for the flash memory cell 100. Described below is a typical reading operation of the flash memory device 100. Such a reading operation generally includes a generic reading operation or a reading verification operation for program verification.

During reading and reading verification operations, however, a channel voltage of the flash memory cell 100 can rise to an undesired level by a bias condition with string and ground selection lines SSL and GSL and selected and unselected word lines, as shown in FIG. 3. Referring to FIG. 3, if a memory cell Mk coupled to a selected word line WLk has been programmed, a channel voltage between the string selection line SSL and the selected word line WLk becomes a biased level of the corresponding bit line while a channel voltage between the word line WLk and the ground selection line GSL increases by the unselected read voltage (Vread) that is applied to the unselected word lines (channel boosting). Such an increased channel voltage induces a voltage difference between the upper and lower channels on the selected word line WLk. This voltage difference generates a leakage current through the memory cell Mk toward the string selection line SSL from the ground selection line GSL. This leakage current can inadvertently program an unselected memory cell by a hot-electron injection effect, which is referred to as 'read disturbance.' Such read disturbance should be blocked therefrom for the purpose of improving the reliability of the flash memory device.

SUMMARY OF THE DISCLOSED TECHNOLOGY

Embodiments of the disclosed technology are directed to a flash memory device that is substantially or completely free from read disturbance.

Embodiments of the disclosed technology are also directed to methods of reading a flash memory device, such methods rendering the flash memory device substantially or completely free from read disturbance.

In one embodiment of the disclosed technology, a method of reading a flash memory device includes: (a) driving a selected word line by applying a selection voltage and driving unselected word lines by applying a first voltage; (b) driving the unselected word lines and the first and second selection lines by applying a second voltage that is higher than the first voltage; and (c) reading data from a memory cell that is coupled to the selected word line.

In another embodiment, the first and second selection lines are driven in a ground voltage during step (a).

In another embodiment, the selection voltage is leveled between threshold voltage distributions of programmed and non-programmed memory cells.

In another embodiment, the second voltage is leveled to make the memory cell conductive regardless of whether the memory cell is programmed.

In another embodiment, the first selection line is a string selection line.

In another embodiment, the string selection line is coupled to a gate of a string selection transistor.

In another embodiment, the string selection transistor is placed between a bit line and a memory cell string.

In another embodiment, the second selection line is a ground selection line.

In another embodiment, the ground selection line is coupled to a gate of a ground selection transistor.

In another embodiment, the ground selection transistor is placed between a memory cell string and a common source line.

In another embodiment, a common source line is driven using a ground voltage.

In another embodiment of the disclosed technology, a method of reading a flash memory device includes: (a) driving a selected word line by applying a selection voltage and driving unselected word lines and first and second selection lines by applying a second voltage; (b) driving the second selection line by applying a ground voltage; (c) driving the second selection line by applying the second voltage; and (d) reading data from a memory cell that is coupled to the selected word line.

In another embodiment, a channel voltage generated in a memory cell string is discharged into a bit line or a common source line during step (a).

In another embodiment, the selected word line is driven using the selection voltage and the unselected word lines and the first selection line are driven using the second voltage during step (b).

In another embodiment, a bit line is precharged to a voltage level during step (b).

In another embodiment, the selected word line is driven using the selection voltage and the unselected word lines and the first selection line are driven using the second voltage during step (c).

In another embodiment, a common source line is driven using a ground voltage.

In another embodiment of the disclosed technology, a method of reading a flash memory device includes: (a) driving a first selection line by applying a ground voltage and driving a selected word line, unselected word lines, and a second selection line by applying a second voltage; (b) driving the selected word line by applying a ground voltage; (c) driving the selected word line by applying a selection voltage and driving the unselected word lines and the first and second selection lines by applying the second voltage; and (d) reading data from a memory cell that is coupled to the selected word line.

In another embodiment, a channel voltage generated in a memory cell string is discharged into a common source line during step (a).

In another embodiment, a common source line is driven by applying a ground voltage.

In another embodiment of the disclosed technology, a method of reading a flash memory device includes: driving a selected word line by applying a selection voltage, driving unselected word lines and a first selection line by applying a second voltage, driving a second selection line by applying a ground voltage, and driving a common source line by applying a third voltage that is higher than the ground voltage; driving the second selection line by applying the second voltage and driving the common source line by applying the ground voltage; and reading data from a memory cell that is coupled to the selected word line.

In another embodiment of the disclosed technology, a method of reading a flash memory device includes: driving a selected word line by applying a selection voltage, driving unselected word lines by applying a first voltage, and driving a common source line by applying a third voltage that is higher than a ground voltage; driving the unselected word lines and the first and second selection lines by applying a second voltage that is higher than the first voltage; and reading data from a memory cell that is coupled to the selected word line.

In another embodiment, the first and second selection lines are driven by applying the ground voltage during step (a).

In another embodiment of the disclosed technology, a flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a first voltage, drive the unselected word lines and first and second selection lines by applying a second voltage that is higher than the first voltage, and control the row selector and page buffer to read data from the selected memory cells that are coupled to the selected word line.

In another embodiment, the selection voltage is leveled between threshold voltage distributions of programmed and non-programmed memory cells.

In another embodiment, the second voltage is leveled to make the memory cell conductive regardless of whether the memory cell is programmed.

In another embodiment, the first selection line is a string selection line.

In another embodiment, the string selection line is coupled to a gate of a string selection transistor.

In another embodiment, the string selection transistor is placed between a bit line and a memory cell string.

In another embodiment, the second selection line is a ground selection line.

In another embodiment, the ground selection line is coupled to a gate of a ground selection transistor.

In another embodiment, the ground selection transistor is placed between a memory cell string and a common source line.

In another embodiment of the disclosed technology, a flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a second voltage, drive the second selection line by applying a ground voltage, drive the second selection line by applying the second voltage, and control the row selector and page buffer to read data from the selected memory cells that are coupled to the selected word line.

In another embodiment, a bit line is precharged to a predetermined voltage level while the second selection line is driven by the ground voltage.

In another embodiment of the disclosed technology, a flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line, unselected word lines, and a second selection line by applying a second voltage, drive a first selection line by applying a ground voltage, drive the selected word line by applying the ground voltage, drive the selected word line by applying a selection voltage, drive the unselected word lines and first and second selection lines by applying the second voltage, and control the row selector and page buffer to read data from the selected memory cells that are coupled to the selected word line.

In another embodiment, a channel voltage of a memory cell string is discharged into a common source line while the selected and unselected word lines and the second selection line are driven by the second voltage and the first selection line is driven by the ground voltage.

In another embodiment of the disclosed technology, a flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines and a first selection line by applying a second voltage, drive a second selection line by applying the ground voltage, drive a common source line by applying a third voltage that is higher than the ground voltage, drive the second selection line by applying the second voltage, drive the common source line by applying the ground voltage, and control the row selector and page buffer to read data from the selected memory cells that are coupled to the selected word line.

In another embodiment of the disclosed technology, a flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a first voltage, drive a common source line by applying a third voltage that is higher than a ground voltage, drive the unselected word lines and first and second selection lines by applying a second voltage that is higher than the first voltage, and control the row selector and page buffer to read data from the selected memory cells that are coupled to the selected word line.

In another embodiment of the disclosed technology, a memory card includes a flash memory device and a controller configured to control the flash memory device. The flash memory device can be read by a method that includes: driving a selected word line by applying a selection voltage and driving unselected word lines by applying a first voltage; driving the unselected word lines and first and second selection lines by applying a second voltage that is higher than the first voltage; and reading data from a memory cell that is coupled to the selected word line.

In another embodiment of the disclosed technology, a memory card includes a flash memory device and a controller configured to control the flash memory device. The flash memory device can be read by a method that includes: driving a selected word line by applying a selection voltage and driving unselected word lines and first and second selection lines by applying a second voltage; driving the second selection line by applying a ground voltage; driving the second selection line by applying the second voltage; and reading data from a memory cell that is coupled to the selected word line.

In another embodiment of the disclosed technology, a memory card includes a flash memory device and a controller configured to control the flash memory device. The flash memory device can be read by a method that includes: driving a first selection line by applying a ground voltage and driving a selected word line, unselected word lines, and a second selection line by applying a second voltage; driving the selected word line by applying a ground voltage; driving the selected word line by applying a selection voltage and driving the unselected word lines and the first and second selection lines by applying the second voltage; and reading data from a memory cell that is coupled to the selected word line.

In another embodiment of the disclosed technology, a memory card includes a flash memory device and a controller configured to control the flash memory device. The flash memory device can be read by a method that includes: driving a selected word line by applying a selection voltage, driving unselected word lines and a first selection line by applying a second voltage, driving a second selection line by applying a ground voltage, and driving a common source line by applying a third voltage that is higher than the ground voltage; driving the second selection line by applying the second voltage and driving the common source line by applying the ground voltage; and reading data from a memory cell that is coupled to the selected word line.

In another embodiment of the disclosed technology, a memory card includes a flash memory device and a controller configured to control the flash memory device. The flash memory device can be read by a method that includes: driving a selected word line by applying a selection voltage, driving unselected word lines by applying a first voltage, and driving a common source line by applying a third voltage that is higher than a ground voltage; driving the unselected word lines and the first and second selection lines by applying a second voltage that is higher than the first voltage; and reading data from a memory cell that is coupled to the selected word line.

In another embodiment of the disclosed technology, a memory card includes a flash memory device and a controller configured to control the flash memory device. The flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a first voltage, drive the unselected word lines and first and second selection lines by applying a second voltage that is higher than the first voltage, and control the row selector and page buffer to read data from the selected memory cells that are coupled to the selected word line.

In another embodiment of the disclosed technology, a memory card includes a flash memory device and a controller configured to control the flash memory device. The flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a second voltage, drive the second selection line by applying a ground voltage, drive the second selection line by applying the second voltage, and control the row selector and page buffer to read data from the selected memory cells that are coupled to the selected word line.

In another embodiment of the disclosed technology, a memory card includes a flash memory device and a controller configured to control the flash memory device. The flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line, unselected word lines, and a second selection line by applying a second voltage, drive a first selection line by applying a ground voltage, drive the selected word line by applying the ground voltage, drive the selected word line by applying a selection voltage, drive the unselected word lines and first and second selection lines by applying the second voltage, and control the row selector and page buffer to read data from the selected memory cells that are coupled to the selected word line.

In another embodiment of the disclosed technology, a memory card includes a flash memory device and a controller configured to control the flash memory device. The flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines and a first selection line by applying a second voltage, drive a second selection line by applying the ground voltage, drive a common source line by applying a third voltage that is higher than the ground voltage, drive the second selection line by applying the second voltage, drive the common source line by applying the ground voltage, and control the row selector and page buffer to read data from the selected memory cells that are coupled to the selected word line.

In another embodiment of the disclosed technology, a memory card includes a flash memory device and a controller configured to control the flash memory device. The flash memory device includes: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a first voltage, drive a common source line by applying a third voltage that is higher than a ground voltage, drive the unselected word lines and first and second selection lines by applying a second voltage that is higher than the first voltage, and control the row selector and page buffer to read data from the selected memory cells that are coupled to the selected word line.

In another embodiment of the disclosed technology, a solid state disk having a flash memory device is read by a method that includes: driving a selected word line by applying a selection voltage, driving unselected word lines by applying a first voltage, and driving a common source line by applying a third voltage that is higher than a ground voltage; driving the unselected word lines and the first and second selection lines by applying a second voltage that is higher than the first voltage; and reading data from a memory cell that is coupled to the selected word line.

The flash memory device of the solid state disk can include: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a first voltage, drive the unselected word lines and first and second selection lines by applying a second voltage that is higher than the first voltage, and control the row selector and page buffer to read data from the selected memory cells that are coupled to the selected word line.

Alternatively, the flash memory device of the solid state disk can include: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a second voltage, drive the second selection line by applying a ground voltage, drive the second selection line by applying the second voltage, and control the row selector and page buffer to read data from the selected memory cells that are coupled to the selected word line.

Alternatively, the flash memory device of the solid state disk can include: a memory cell array having multiple memory cells arranged in rows and columns; a row selector configured to select one of the rows in the memory cell array; a page buffer configured to sense data from selected memory cells through the columns; and a control logic circuit configured to drive a selected word line, unselected word lines, and a second selection line by applying a second voltage, drive a first selection line by applying a ground voltage, drive the selected word line by applying the ground voltage, drive the selected word line by applying a selection voltage, drive the unselected word lines and first and second selection lines by applying the second voltage, and control the row selector and page buffer to read data from the selected memory cells that are coupled to the selected word line.

Alternatively, the flash memory device of the solid state disk can include: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines and a first selection line by applying a second voltage, drive a second selection line by applying the ground voltage, drive a common source line by applying a third voltage that is higher than the ground voltage, drive the second selection line by applying the second voltage, drive the common source line by applying the ground voltage, and control the row selector and page buffer to read data from the selected memory cells that are coupled to the selected word line.

Alternatively, the flash memory device of the solid state disk can include: a memory cell array having multiple memory cells arranged in rows and columns; a row selector configured to select one of the rows in the memory cell array; a page buffer configured to sense data from selected memory cells through the columns; and a control logic circuit configured to drive a selected word line by applying a selection voltage, drive unselected word lines by applying a first voltage, drive a common source line by applying a third voltage that is higher than a ground voltage, drive the unselected word lines and first and second selection lines by applying a second voltage that is higher than the first voltage, and control the row selector and page buffer to read data from the selected memory cells that are coupled to the selected word line.

The foregoing and other features, objects, and advantages of the disclosed technology will become more readily apparent from the following detailed description, which proceeds with reference to the accompanying drawings.

DETAILED DESCRIPTION OF PREFERRED EMBODIMENTS

Figure 1:
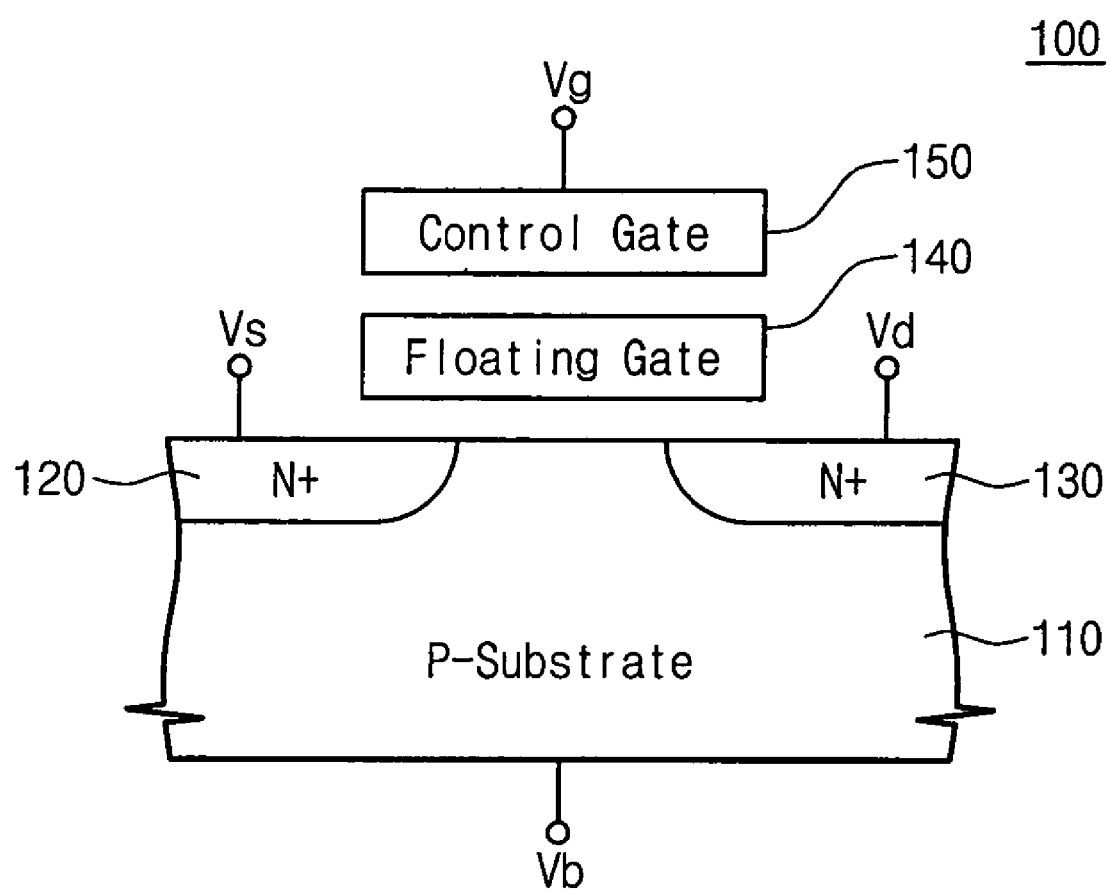
FIG. 1 is a sectional diagram of a generic flash memory cell.

Preferred embodiments of the present invention are described in detail below, including a nonvolatile memory device (e.g., a flash memory) as an example in illustrating structural and operational features of the disclosed technology.

The disclosed technology may, however, be embodied in different forms and should not be construed as being limited to the embodiments described herein. Rather, these embodiments are provided so that this disclosure will be thorough and complete fully convey the scope of the disclosed technology to those skilled in the art. Like reference numerals refer to like elements throughout the accompanying figures.

Figure 2:
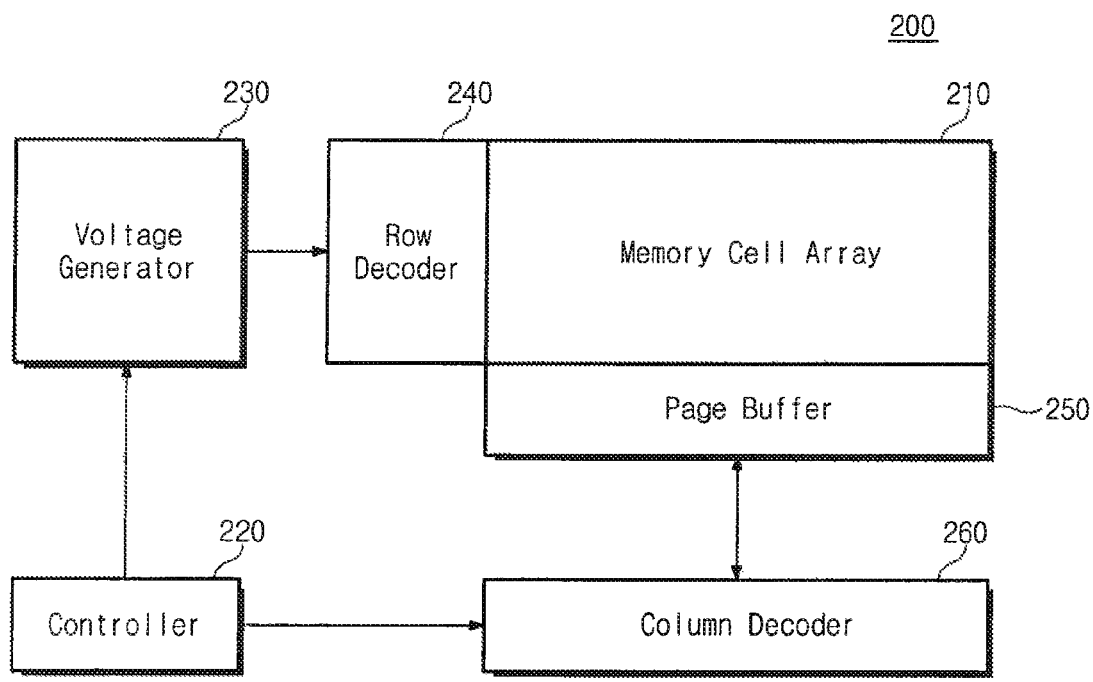
FIG. 2 is a functional block diagram of a nonvolatile memory device in accordance with the disclosed technology.

FIG. 2 is a functional block diagram of a nonvolatile memory device 200 having a memory cell array 210, a control logic circuit 220, a voltage generator 230, a row decoder 240, a page buffer 250, and a column decoder 260.

Although not shown in FIG. 2, the memory cell array 210 is composed of multiple memory cells that are disposed on a matrix of rows (or word lines) and columns (or bit lines). The memory cells are arranged in a logical NAND or NOR structure. In certain embodiments, the memory cells in the array are configured in a NAND structure. In the NAND array structure, a group of memory cells connected to each other in series constitutes a unit string. The memory cells of the unit string share a bit line.

The control logic circuit 220 controls operations of the nonvolatile memory device 200. In certain embodiments, the control logic circuit 220 controls a series of transactions regarding reading and reading verification operations. However, those of skill in the art will recognize that the control logic circuit 220 is not restricted to these functions. For instance, the control logic circuit 220 can also control erasing and testing operations of the nonvolatile memory device 200.

The voltage generator 230 is controlled by the control logic circuit 220, and generates various levels of voltages to be applied to a selected word line, unselected word lines, a string selection line (SSL), a ground selection line (GSL), and a common source line (CSL).

The row decoder 240 is controlled by the control logic circuit 220, and drives a selected word line, unselected word lines, a string selection line (SSL), a ground selection line (GSL), and a common source line (CSL) in response to a row address (not shown).

The page buffer 250 functions as a sense amplifier or a writing driver. During a reading operation, for example, the page buffer 250 can read data out of the memory cell array 210. During a programming operation, however, the page buffer 250 can drive bit lines to a power source voltage VCC or a ground voltage GND in response to data that is input through the column decoder 260. The column decoder 260 can read data out of the page buffer 250 or transfer data to the page buffer 250 in response to a column address. Although not shown in FIG. 2, the column decoder 260 includes an address counter that continuously generates column addresses by sequentially incrementing an address value from an initial column address. The incremental column addressing mean that page data read out or to be programmed is transferred sequentially in the unit bit line structure.

Figure 3:
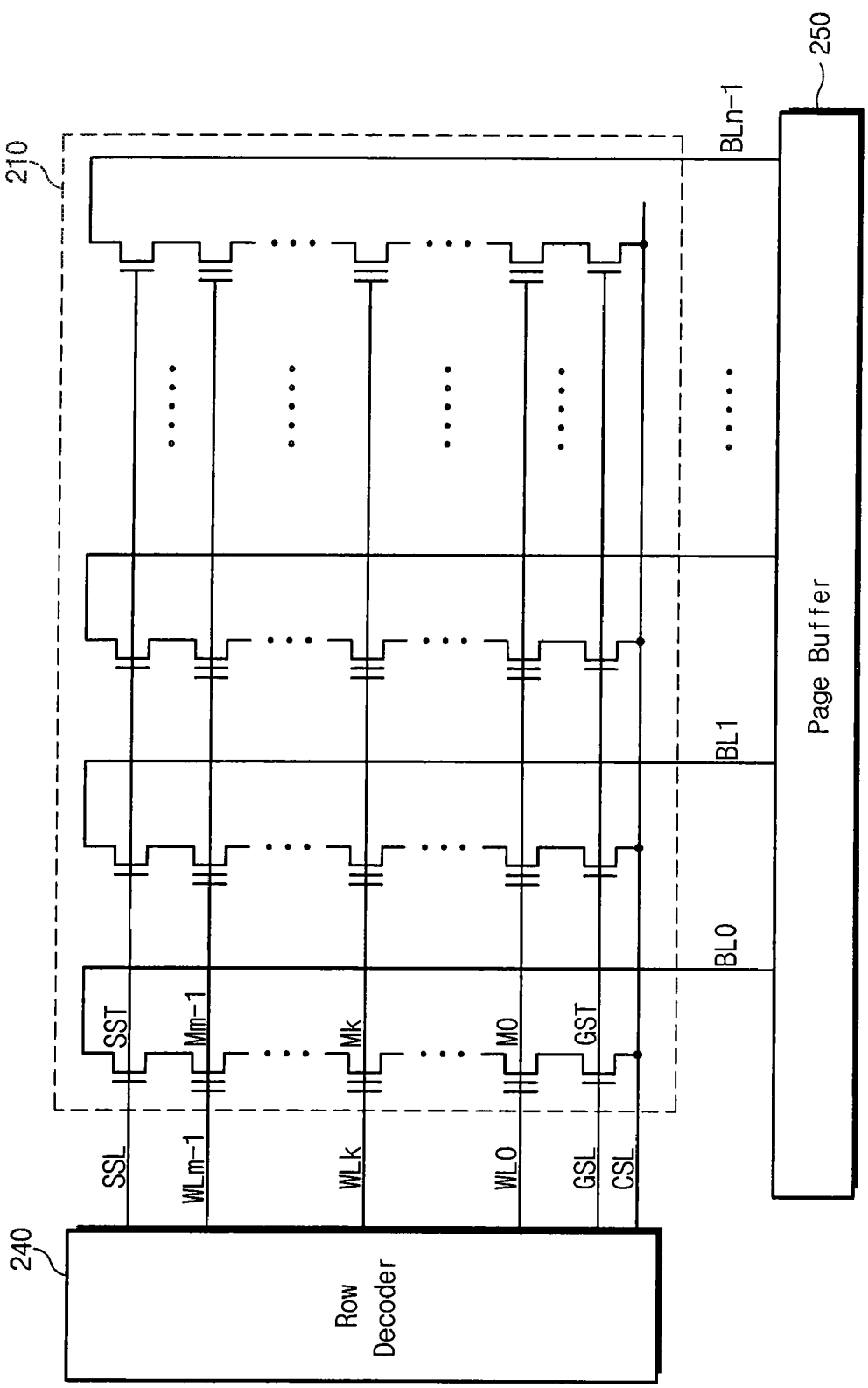
FIG. 3 is a circuit diagram of the memory cell array shown in FIG. 2.

FIG. 3 is a circuit diagram of the memory cell array 210 shown in FIG. 2. The memory cell array 210 has multiple word lines WL0~WLm−1, multiple bit lines BL0~BLn−1, and multiple memory cells. A row decoder 240 that is connected to the string selection line SSL, the word lines WL0~WLm−1, the ground selection line GSL, and the common source line CSL is disposed at a side of the memory cell array 210. While the common source line CSL is driven by the row decoder 240 in the example, it can be also driven by a different functional unit.

The row decoder 240 selects a word line by applying a response to a given row address. A page buffer 250 that is connected to the plural bit lines BL0~BLn−1 is disposed at the other side of the memory cell array 210.

During a reading operation of the nonvolatile memory device, it is important to properly arrange a bias condition in the memory cells. A bias condition is determined by a voltage to the string selection line SSL, a voltage to unselected word lines, a voltage to a selected word line, a voltage to the ground selection line GSL, a voltage to the common source line CSL, and a voltage to the bit line.

Various bias conditions for lessening read disturbance are described below.

Figure 4:
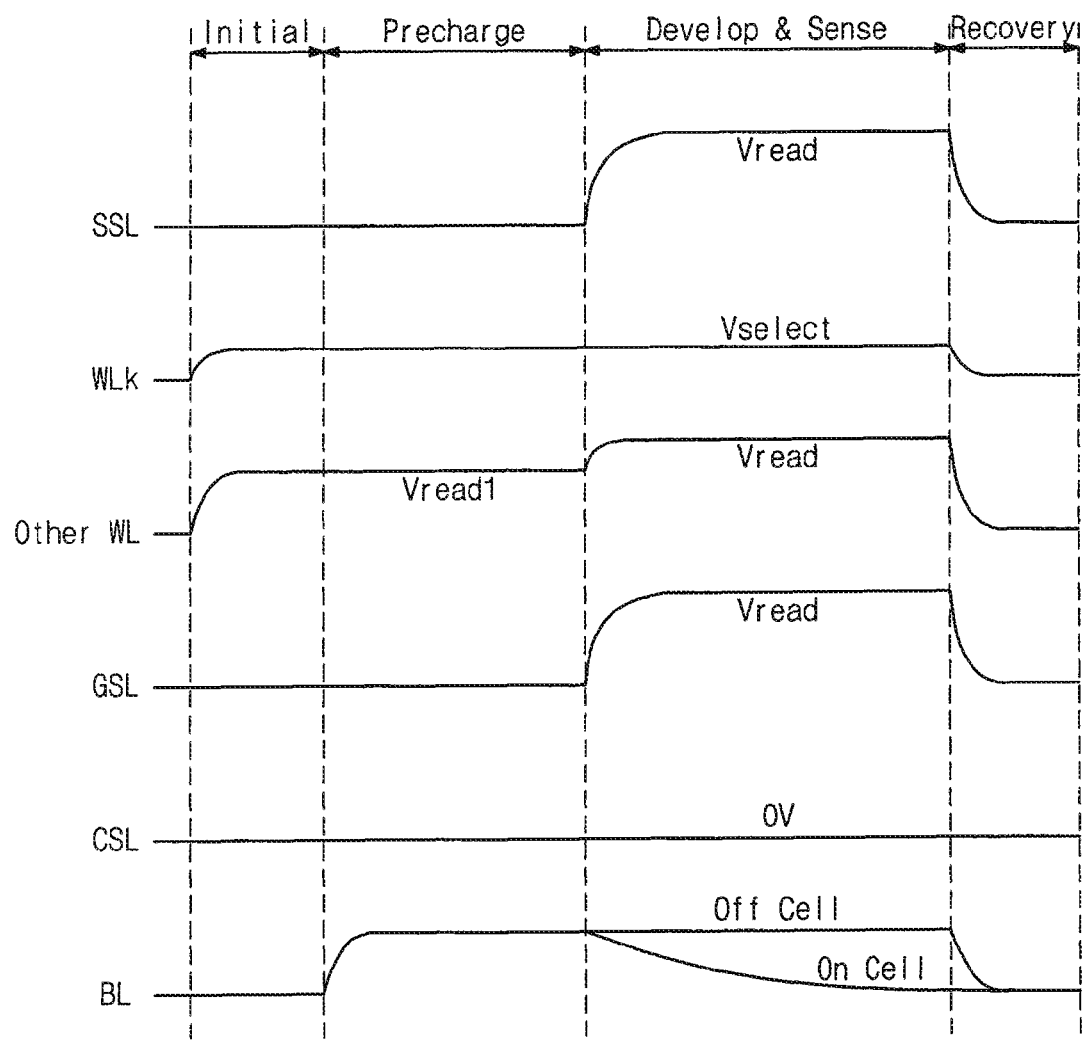
FIG. 4 is a timing diagram showing a first exemplary method of reading a nonvolatile memory device in accordance with the disclosed technology.
Figure 5:
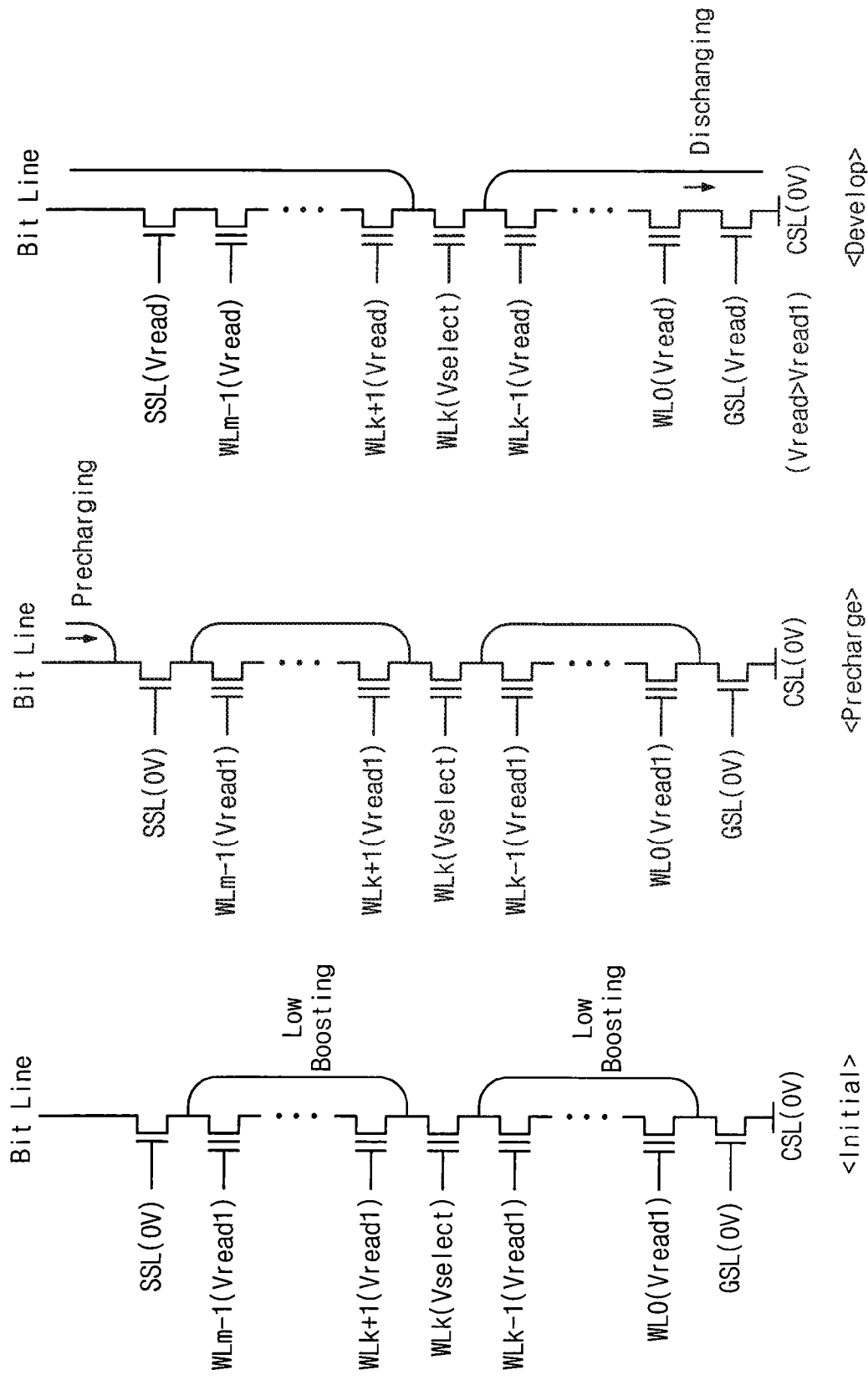
FIG. 5 is a diagram illustrating voltage arrangements of memory strings according to the bias conditions shown in the timing diagram of FIG. 4.

FIG. 4 is a timing diagram illustrating a first exemplary method of reading a nonvolatile memory device in accordance with the disclosed technology, and FIG. 5 is a diagram illustrating voltage arrangements of memory strings according to the bias conditions shown in the timing diagram of FIG. 4.

Referring to FIG. 4, the first exemplary method of reading the nonvolatile memory device includes an initial setting period, a precharging period, a developing/sensing period, and a recovery period.

During the initial setting period, which is ahead of the precharging period, voltages for the lines SSL, WL0~WLm-1, GSL, CSL, and BL0~BLn-1 are set at default levels. Here, the $k^{th}$ word line WLk is coupled to a control gate of a selected cell transistor. During the precharging period, the bit lines BL0~BLn-1 are charged up to a predetermined voltage level. During the developing/sensing period, the string and ground selection transistors SST and GST are conductive to sense a current flowing through the memory cell string. According to whether there is a current through the memory cell string, data stored in a selected memory cell is determined. During the recovery period, the voltages of the lines are reset to the default levels for the next cycle of the reading operation.

It is assumed hereinafter that a selected memory cell (e.g., a memory cell to be read out) is programmed. Thus, even if a selection voltage Vselect is applied to the control gate of the selected memory cell, the memory cell is not turned on. The selection voltage Vselect may be leveled between a threshold voltage distribution of programmed memory cells and a threshold voltage distribution of non-programmed memory cells. And, for convenience of description, it is assumed that a selected memory cell is located at the middle of the memory cell string.

One of skill in the art will recognize, however, that the memory cell that is coupled to the selected word line WLk may be conditioned in a non-programmed state and that a selected memory cell may be located at the edge of the memory cell string.

As illustrated in FIG. 4, during the initial setting and precharging periods, since the ground voltage GND is applied to the string and ground selection lines SSL and GSL, the string and ground selection transistors SST and GST are turned off. The selected memory cell, which assumed to be programmed, is also turned off. Channels between the string selection transistor SST and the selected memory cell can thus be floated. Also, channels between the selected memory cell and the ground selection transistor GST can be floated by the turning off of the selected memory cell. This pattern of bias condition is illustrated in FIG. 5.

Potentials of the floating channels can be raised in a mechanism referred to as 'channel boosting' due to the unselective read voltage Vread applied to unselected word lines. If the potential of the floating channel is much higher than a potential of the bit line, a leakage current flows toward the bit line through the string selection transistor SST. Such a leakage current can cause an unselected memory cell transistor adjacent to the string selection transistor SST to be programmed by hot carrier injection. Furthermore, leakage current flows toward the common source line CSL through the ground selection line GSL, which may cause undesirable programming of a memory cell transistor adjacent to the ground selection transistor GST. Additionally, leakage current flows to an adjacent channel through the selected cell transistor, thereby undesirably programming a memory cell transistor adjacent to the selected cell transistor. These effects must be reduced or eliminated in order to enhance or optimize the reliability of the flash memory device.

During the initial setting and precharging periods of the first exemplary method, as the voltage Vread1 that is lower than a normal read voltage Vread is applied to unselected word lines, a boosting level of the channel becomes lower. Such a lowered boosting level of the channel is insufficient to induce hot electron injection. As a result, read disturbance is effectively prevented. So long as a voltage lower than the read voltage Vread is applied to unselected word lines, the voltage applied thereto can be increased in a stepwise manner.

During the precharging period, the bit lines are charged up to a predetermined voltage line. After precharging the bit lines, the normal read voltage Vread is applied to unselected word lines by applying the developing/sensing period to sense whether the selected memory cell has been programmed.

As described above, a voltage Vread1 lower than the read voltage Vread is applied to unselected word lines during the initial setting and precharging periods. As a result, boosting levels of floating channels become lower. Accordingly, a voltage difference between the boosted channel and the bit line or between the boosted channel and the common source line is established, which is effective in reducing leakage current flowing through or toward the bit line or the common source line. As a result, there is no generation of read disturbance (e.g., as would otherwise be caused by hot electron injection).

Figure 6:
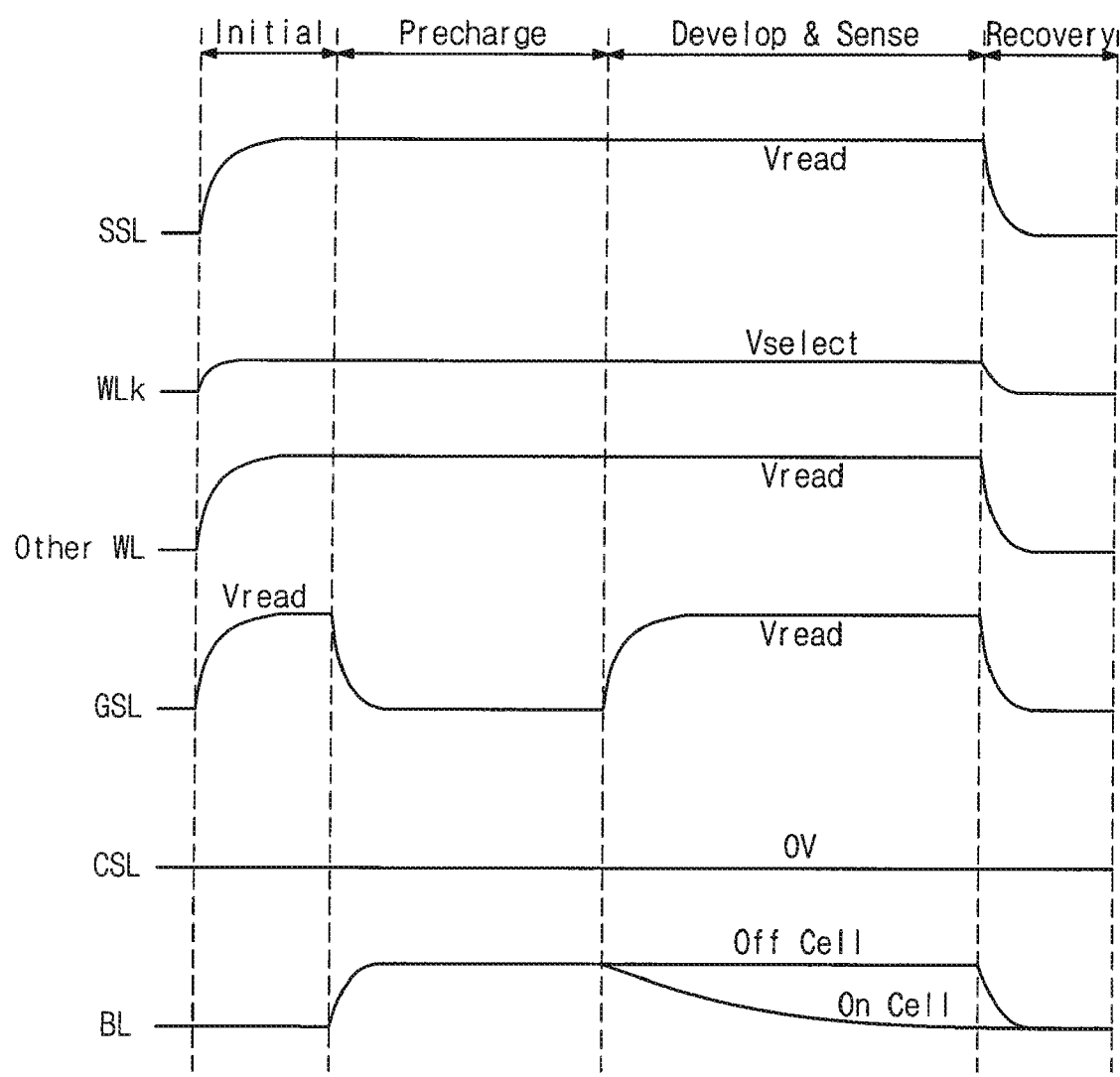
FIG. 6 is a timing diagram showing a second exemplary method of reading a nonvolatile memory device in accordance with the disclosed technology.
Figure 7:
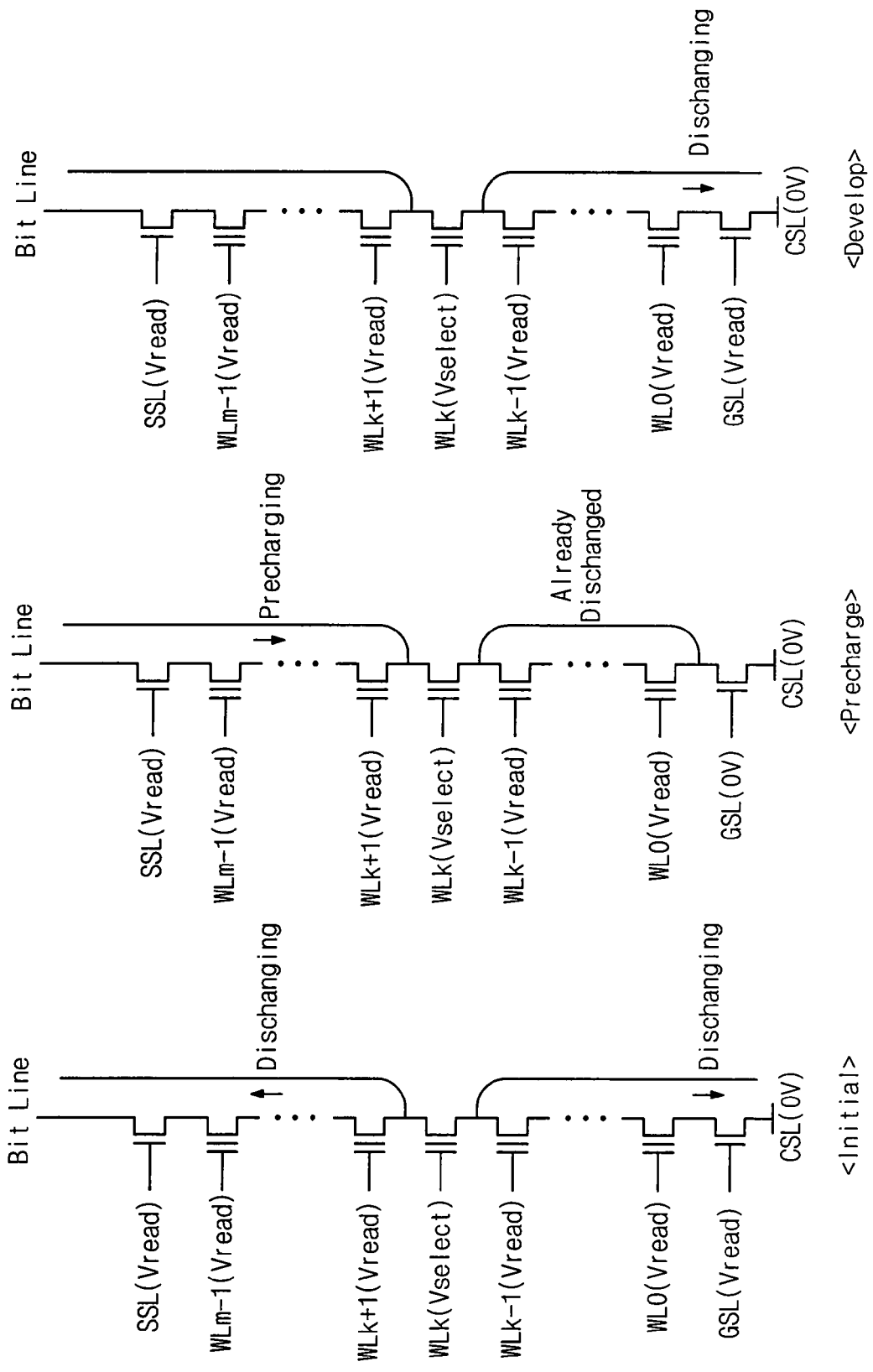
FIG. 7 is a diagram illustrating voltage arrangements of memory strings according to the bias conditions shown in the timing diagram of FIG. 6.

FIG. 6 is a timing diagram illustrating a second exemplary method of reading a nonvolatile memory device in accordance with the disclosed technology, and FIG. 7 is a diagram illustrating voltage arrangements of memory strings according to the bias conditions shown in the timing diagram of FIG. 6.

During the initial setting period, the read voltage Vread is applied to the string and ground selection lines SSL and GSL. Then, the string and ground selection transistors SST and GST are turned on. Channels of the memory cell transistors are then connected to the bit line through the string selection transistor SST and to the common source line CSL through the ground selection transistor GST. This means that the boosted channel voltages are discharged by way of the bit line BL or the common source line CSL. Thus, any increase of voltage due to channel boosting can be lessened.

During the precharging period, as the read voltage Vread is applied to the string selection line SSL, the string selection transistor SST is turned on. As a potential of the ground voltage (i.e., 0V) is applied to the ground selection line GSL, the ground selection line GST is turned off. During this period, the selected memory cell Mk is turned off because it is conditioned in a programmed state. Channels above the selected memory cell are then precharged to a predetermined voltage level through the bit line. Also, channels between the selected memory cell and the ground selection transistor are floated. However, since the channels between the selected memory cell and the ground selection transistor were already discharged during the initial setting period, there is no generation of hot electron injection. As a result, read disturbance is effectively prevented.

After the precharging period, during the developing/sensing period, the read voltage Vread is applied to the unselected word lines, thereby facilitating sensing whether the selected memory cell has been programmed.

As described above, the string and ground selection transistors SST and GST are all turned off during the initial setting period to discharge the channels, which are boosted by the word lines, by way of the bit line and the common source line CSL. Read disturbance by leakage current is thus prevented because the channel voltages become lower.

Figure 8:
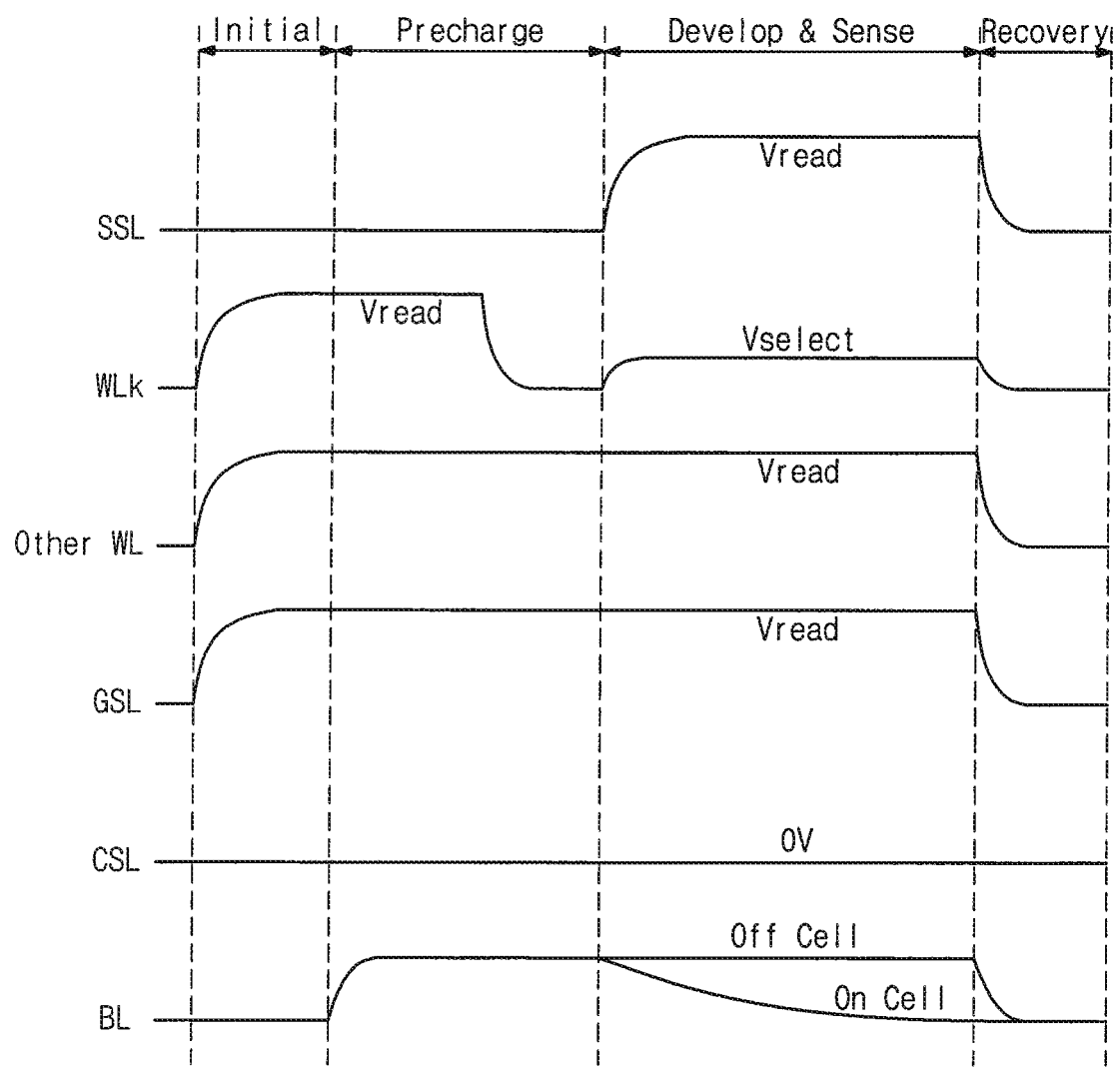
FIG. 8 is a timing diagram showing a third exemplary method of reading a nonvolatile memory device in accordance with the disclosed technology.
Figure 9:
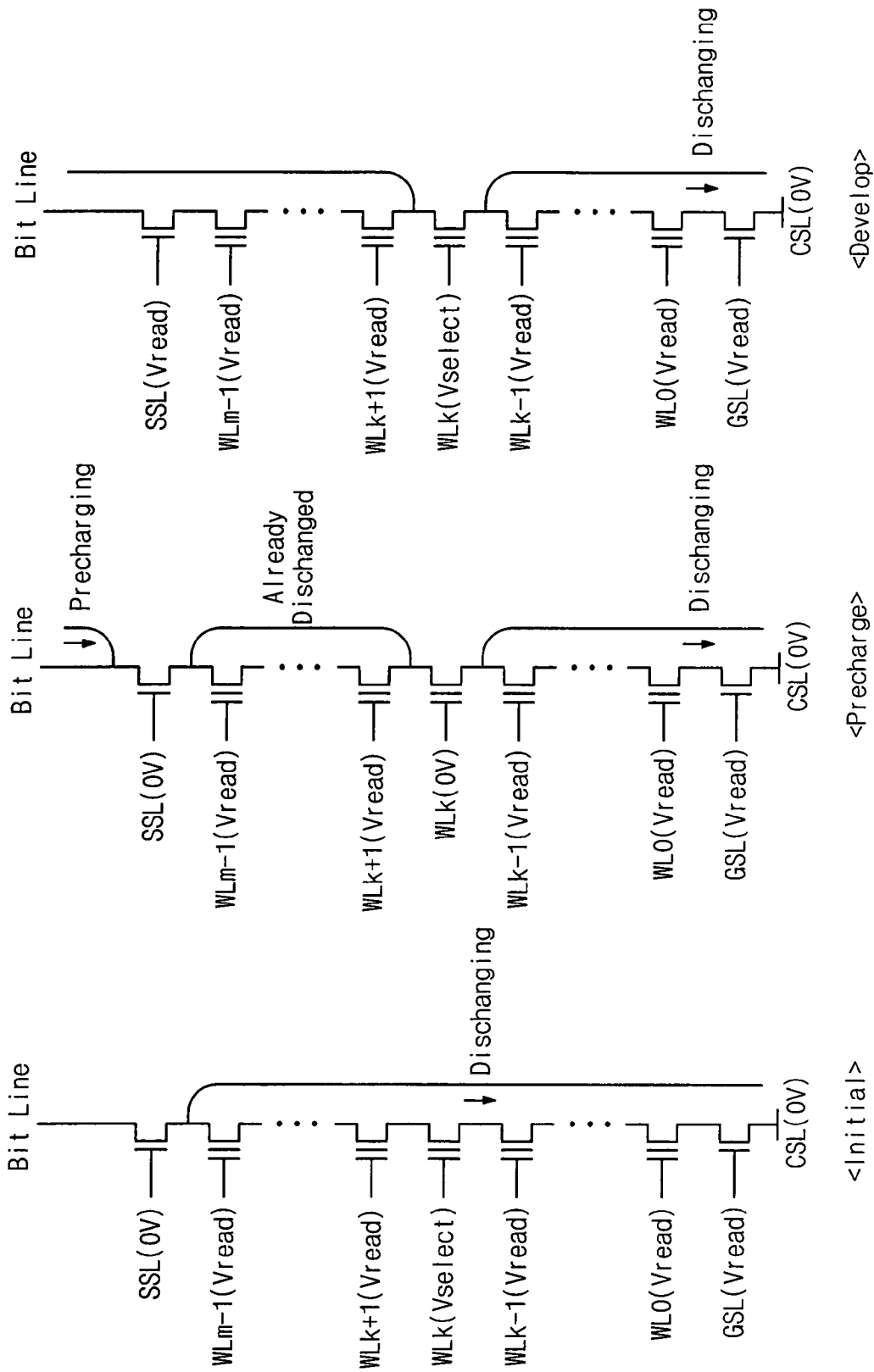
FIG. 9 is a diagram illustrating voltage arrangements of memory strings according to the bias conditions shown in the timing diagram of FIG. 8.

FIG. 8 is a timing diagram illustrating a third exemplary method of reading a nonvolatile memory device in accordance with the disclosed technology, and FIG. 9 is a diagram illustrating voltage arrangements of memory strings according to the bias conditions shown in the timing diagram of FIG. 8.

During the initial setting period, the ground voltage of 0V is applied to the string selection line SSL and the string selection transistor SST is turned off. Then, the memory cell string is electrically isolated from the bit line. As the read voltage Vread is applied to the ground selection line GSL, the ground selection transistor GST is turned on. As the read voltage Vread, which is higher than the selection voltage Vselect, is applied to the selected word line WLk, the selected memory cell is turned on regardless of whether or not it is programmed. The channels of the cell transistors are connected to the common source line CSL through the ground selection transistor GST. Since a potential of the common source line CSL is set to the level of the ground voltage GND, voltages of the channels of the cell transistors are discharged into the common source line CSL.

During the precharging period, a voltage of the selected word line is lowered to the level of the ground voltage GND. Then, a programmed memory cell is turned off. Channels of the cell transistors between the string selection transistor SST and the selected memory cell, and between the selected memory cell and the ground selection transistor GST, are all floated, but there is no leakage current because the channels were discharged during the initial setting period. As a result, read disturbance is effectively prevented.

After the precharging period, during the developing/sensing period, the selection voltage Vselect is applied to the selected word line, thereby facilitating sensing whether the selected memory cell has been programmed.

As described above, the string and ground selection transistor SST is turned off during the precharging period and the read voltage Vread is applied to all of the word lines and the ground selection transistor GST, so that channel voltages of the memory cell transistors are discharged into the common source line CSL. As a result, read disturbance by the channel boosting is effectively prevented.

Figure 10:
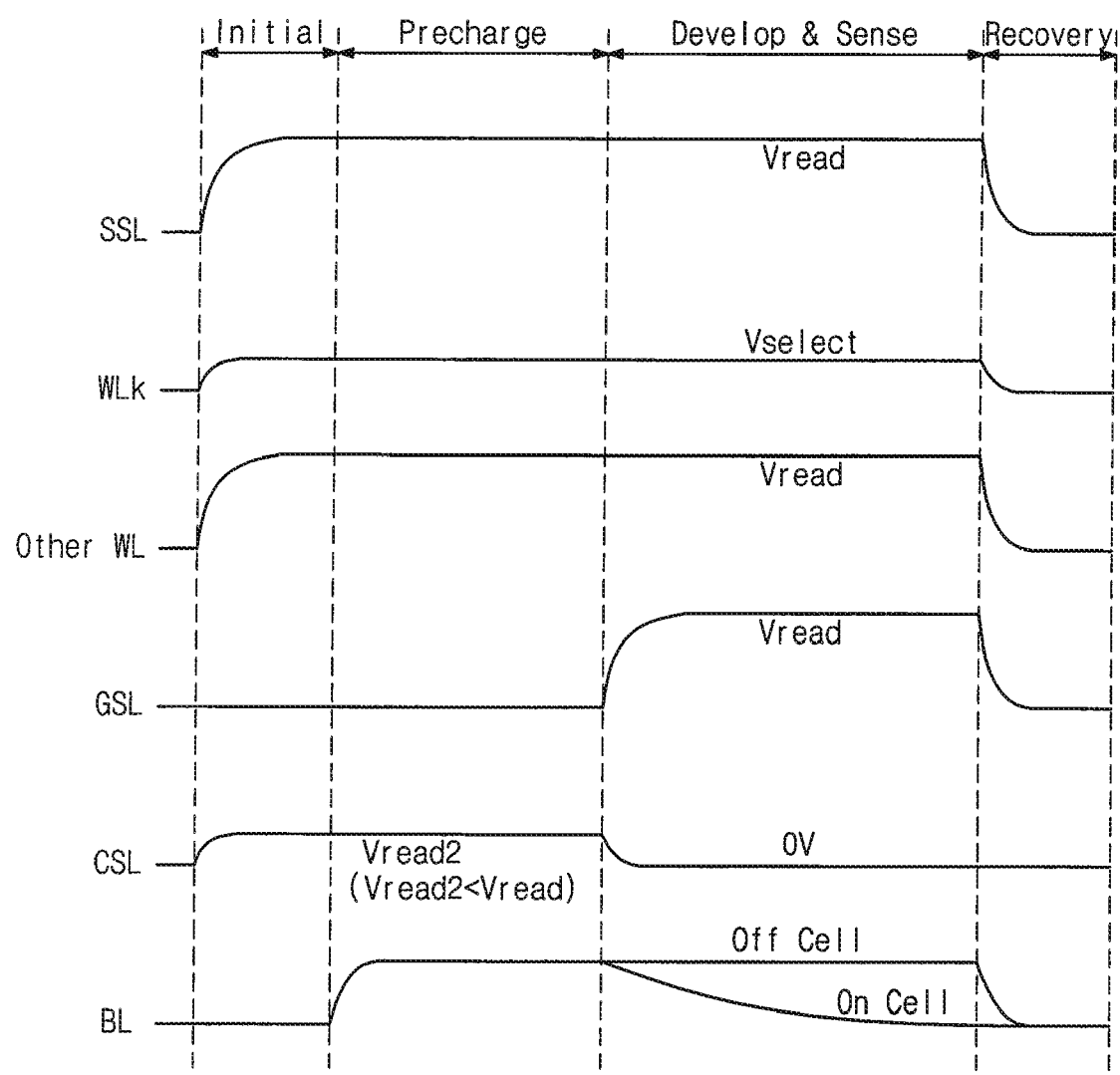
FIG. 10 is a timing diagram showing a fourth exemplary method of reading a nonvolatile memory device in accordance with the disclosed technology.
Figure 11:
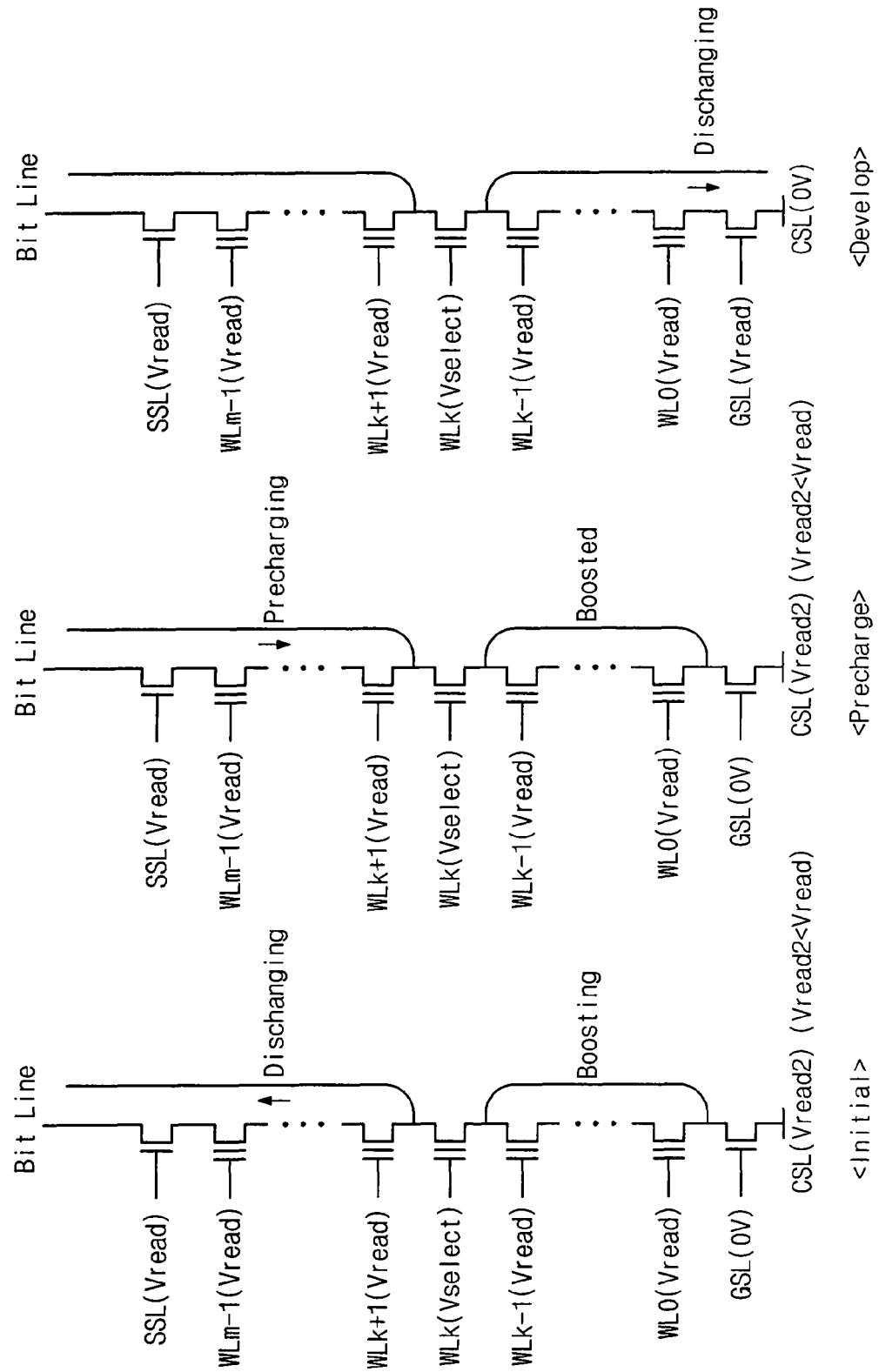
FIG. 11 is a diagram illustrating voltage arrangements of memory strings according to the bias conditions shown in the timing diagram of FIG. 10.

FIG. 10 is a timing diagram illustrating a fourth exemplary method of reading a nonvolatile memory device in accordance with the disclosed technology, and FIG. 11 is a diagram illustrating voltage arrangements of memory strings according to the bias conditions shown in the timing diagram of FIG. 10.

During the initial setting period, the read voltage Vread is applied to the string selection line SSL, so that the string selection transistor SST is turned on. Then, the memory cell string is connected to the bit line BL. As the ground voltage GND is applied to the ground selection line GSL, the ground selection transistor GST is turned off. As the selection voltage Vselect is applied to the selected word line WLk, the selected memory cell that has been programmed is turned off. Channels between the selected memory cell and the ground selection transistor GST are floated. These floating channels are boosted by the reading voltage Vread.

A voltage Vread2 that is higher than the ground voltage (i.e., 0V) is applied to the common source line CSL, decreasing the voltage difference between the drain and the source in the ground selection transistor GST. Thus, current leakage through the ground selection is prevented from the floating channels, thereby curbing read disturbance.

Thus, a positive voltage Vread2 is applied to the common source line CSL in order to decrease a voltage difference between the upper and lower sides of ground selection line GSL, thereby preventing read disturbance by leakage current.

Figure 12:
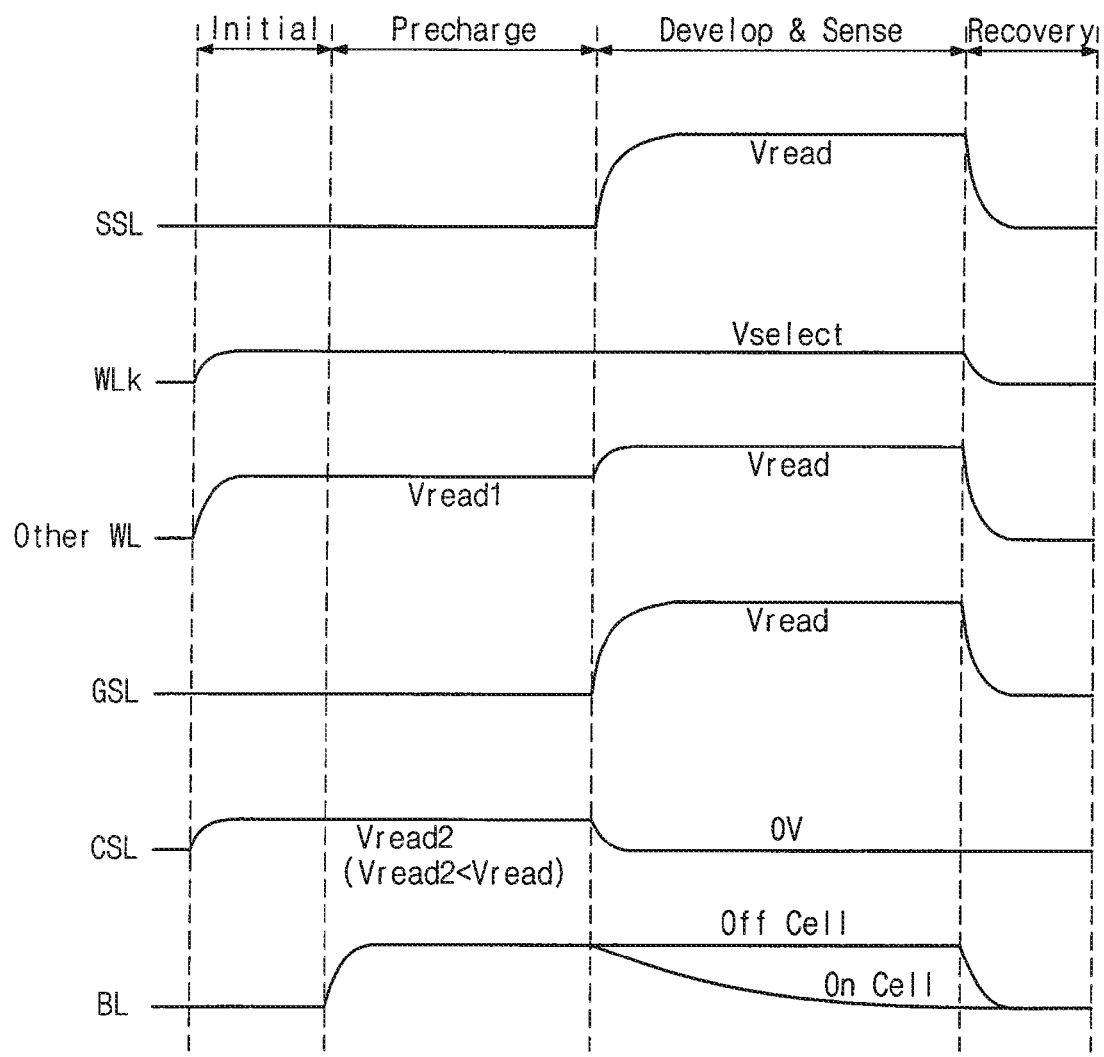
FIG. 12 is a timing diagram showing a fifth exemplary method of reading a nonvolatile memory device in accordance with the disclosed technology.
Figure 13:
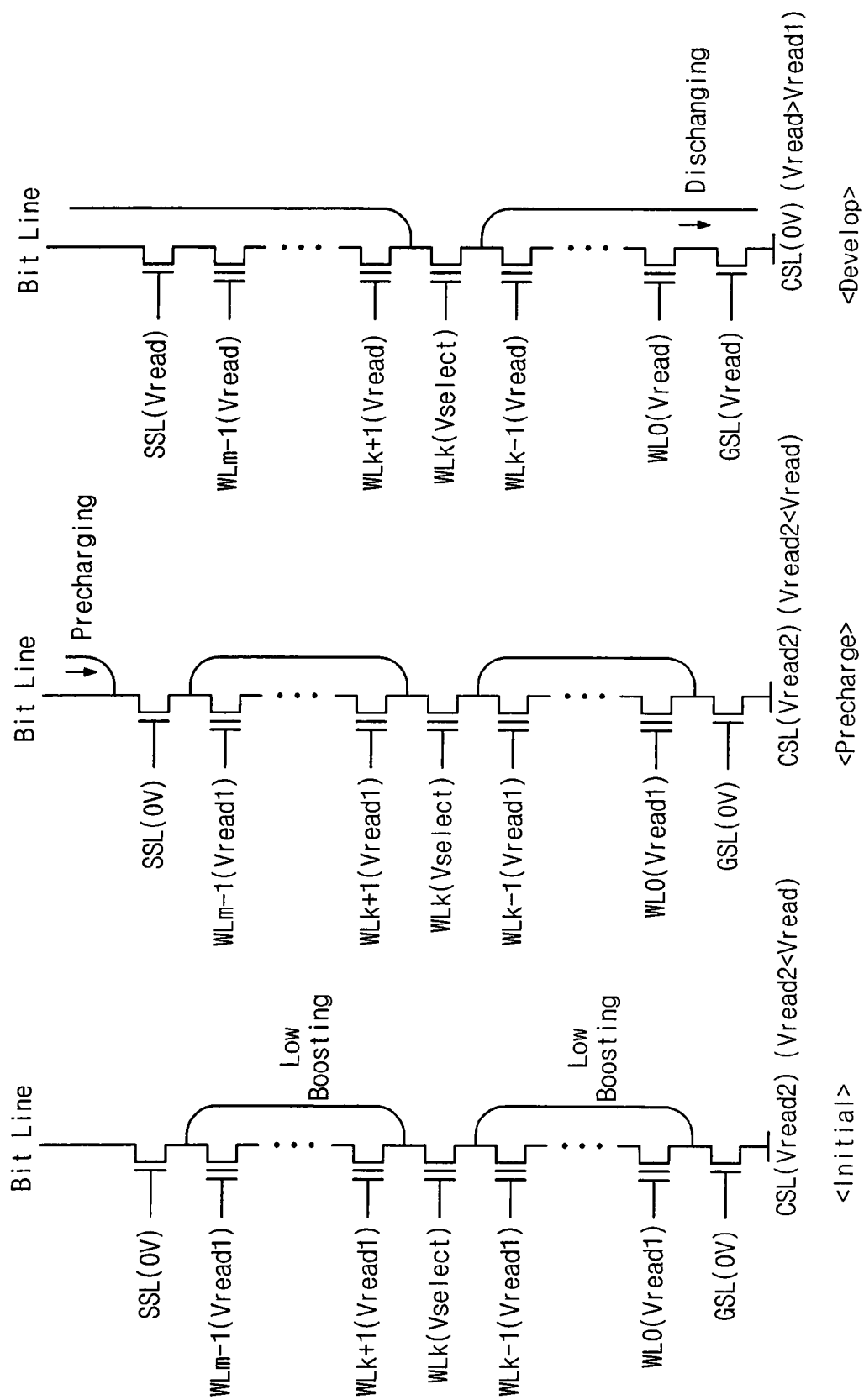
FIG. 13 is a diagram illustrating voltage arrangements of memory strings according to the bias conditions shown in the timing diagram of FIG. 12.

FIG. 12 is a timing diagram illustrating a fifth exemplary method of reading a nonvolatile memory device in accordance with the disclosed technology, and FIG. 13 is a diagram illustrating voltage arrangements of memory strings according to the bias conditions shown in the timing diagram of FIG. 12.

During the initial setting and precharging periods, boosting levels of the channels are lowered because the voltage Vread1, which is lower than the normal read voltage Vread, is applied to unselected word lines. While the voltage Vread1 is only applied once to the unselected word lines in the present example, the voltage may be applied thereto multiple times by increasing the voltage (e.g., in a stepwise manner) up to the read voltage Vread.

In addition, the voltage Vread2, which is higher than the ground voltage GND (i.e., 0V), is applied to the common source line CSL. This is effective in reducing a voltage difference between the drain and the source in the ground selection transistor GST. Thus, current leakage through the ground selection transistor GST is interrupted from the floating channels and, as a result, read disturbance therein is restrained.

As discussed above, read disturbance from the floating channels can be prevented during the reading operation by changing the bias condition. While only five exemplary methods have been described herein, the disclosed technology is also able to provide other embodiments that involve varying the bias condition (e.g., in a similar manner).

Figure 14:
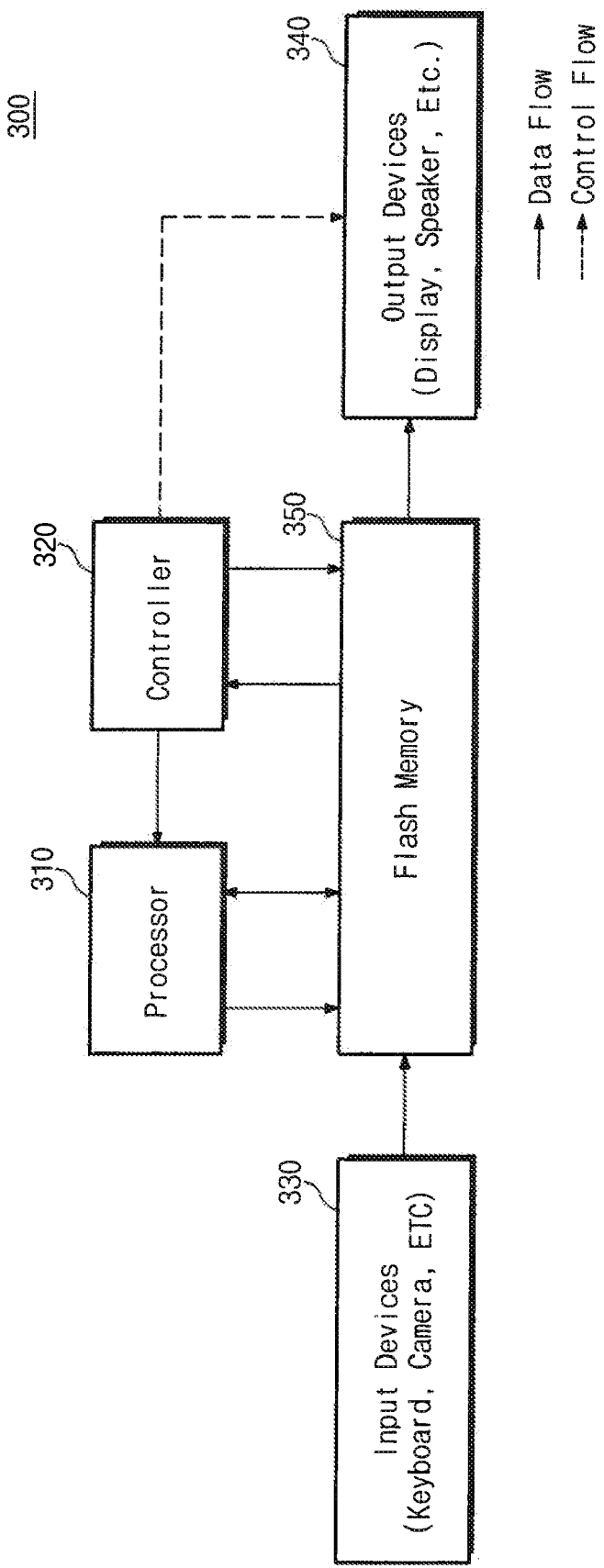
FIG. 14 is a schematic diagram of a computing system having a flash memory in accordance with the disclosed technology.

FIG. 14 is a schematic diagram of a computing system 300 having a flash memory 350 in accordance with the disclosed technology. The computing system 300 includes a processor 310, a controller 320, input devices 330, output devices 340, and the flash memory 350.

The computing system 300 receives data through the input devices 330 (e.g., keyboards or cameras). The received data can include a command or multimedia data such as image data taken by a camera. The received data is stored in the flash memory 350.

The controller 320 controls the various components in response to a command stored in the flash memory 350. The processor 310 processes data or signals in response to control operations by the controller 320. Data processed by the processor 310 is stored in the flash memory 350. The output devices 340 output data from the flash memory 350 in response to control operations of the controller 320. The output devices can provide data from the flash memory 350 in visible form for humans. For example, the output devices 340 can include display devices or speakers.

The flash memory 350 may be configured in a similar fashion as that illustrated in FIG. 2. The flash memory 350 can store N-bit data (where N is a positive integer) to be processed by the processor 310 under control by the controller 320.

The nonvolatile memory 350 and/or the controller 320 can be mounted in the system 300 by way of various types of packages. For instance, the flash memory 350 and/or the controller 320 may be placed on the system 300 by way of virtually any package type such as Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP). The flash memory 350 and the controller 320 can be used to implement a memory card.

Although not shown in FIG. 14, those of skill in the art will recognize that a power supply can be used to provide power to the computing system 300 and that, if the computing system 300 is a type of mobile device, the power supply may include a battery. By improving reliability of the flash memory 350 during reading operations, the computing system 300 itself will be enhanced in terms of the reliability of its operation.

A flash memory device in accordance with the disclosed technology can also be applicable to a solid state disk (SSD). In recent years, SSD products have been marketed as competitive solutions that are suitable for replacing hard disk drives (HDDs). SSDs provide various advantages over HDDs, which operate mechanically, in operation rate, external impact, and power consumption.

As described herein, implementations of the disclosed technology can greatly improve the reliability of a reading operation of a flash memory device by preventing read disturbance (e.g., through changing a bias condition during the reading operation).

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method of reading a flash memory device, comprising:
   (a) driving a selected word line by applying a selection voltage thereto, and driving unselected word lines and first and second selection lines by applying a second voltage thereto;
   (b) driving the second selection line by applying a ground voltage thereto;
   (c) driving the second selection line by applying the second voltage thereto; and
   (d) reading data from a memory cell that is coupled to the selected word line.

2. The method of claim 1, further comprising discharging a channel voltage generated in a memory cell string into a bit line or a common source line during (a).

3. The method of claim 1, further comprising driving the selected word line by applying the selection voltage thereto and driving the unselected word lines and the first selection line by applying the second voltage thereto during (b).

4. The method of claim 1, further comprising precharging a bit line to a predetermined voltage level during (b).

5. The method of claim 1, further comprising driving the selected word line by applying the selection voltage thereto and driving the unselected word lines and the first selection line by applying the second voltage thereto during (c).

6. The method of claim 1, further comprising driving a common source line by applying a ground voltage thereto.

* * * * *